(12) United States Patent
Hirose et al.

(10) Patent No.: US 9,725,804 B2
(45) Date of Patent: Aug. 8, 2017

(54) PROCESSING APPARATUS

(71) Applicant: TOKYO ELECTRON LIMITED, Tokyo (JP)

(72) Inventors: Katsuhito Hirose, Nirasaki (JP); Toshio Miyazawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/820,723

(22) Filed: Aug. 7, 2015

(65) Prior Publication Data

US 2016/0047039 A1 Feb. 18, 2016

(30) Foreign Application Priority Data

Aug. 12, 2014 (JP) ................... 2014-164213

(51) Int. Cl.
| | |
|---|---|
| C23C 16/455 | (2006.01) |
| C23C 16/52 | (2006.01) |
| C23C 16/34 | (2006.01) |
| H01L 21/02 | (2006.01) |
| H01L 21/28 | (2006.01) |

(52) U.S. Cl.
CPC ........ *C23C 16/45544* (2013.01); *C23C 16/34* (2013.01); *C23C 16/45527* (2013.01); *C23C 16/45561* (2013.01); *C23C 16/45565* (2013.01); *C23C 16/45574* (2013.01); *C23C 16/52* (2013.01); *H01L 21/0228* (2013.01); *H01L 21/28194* (2013.01)

(58) Field of Classification Search
None
See application file for complete search history.

(56) References Cited

U.S. PATENT DOCUMENTS

2001/0050039 A1* 12/2001 Park ................. C23C 16/45523
117/102
2004/0126954 A1* 7/2004 Marsh ............... C23C 16/45527
438/200

(Continued)

FOREIGN PATENT DOCUMENTS

| JP | 2009-228059 A | 10/2009 |
|---|---|---|
| JP | 2009-239082 A | 10/2009 |

(Continued)

*Primary Examiner* — Binu Thomas
(74) *Attorney, Agent, or Firm* — Nath, Goldberg & Meyer; Jerald L. Meyer

(57) ABSTRACT

A processing apparatus includes a plurality of first gas supply channels configured to supply a plurality of gases to the process chamber, a second gas supply channel configured to supply a gas to the process chamber, the gas being used in processing the target substrate, a plurality of first valves configured to open and close the plurality of first gas supply channels, a second valve configured to open and close the second gas supply channel, and a controller. One of the plurality of first valves is a follow-up target valve. The controller controls opening/closing operation of the plurality of first valves such that opening durations of the plurality of first valves do not overlap with each other, and controls opening/closing operation of the second valve such that opening duration of the second valve has a predetermined time relationship with opening duration of the follow-up target valve.

5 Claims, 8 Drawing Sheets

(56) References Cited

U.S. PATENT DOCUMENTS

| | | | | |
|---|---|---|---|---|
| 2008/0014352 A1* | 1/2008 | Xi | .................... | H01L 21/28562 |
| | | | | 118/719 |
| 2008/0044569 A1* | 2/2008 | Myo | ................. | C23C 16/45531 |
| | | | | 427/248.1 |
| 2009/0117746 A1* | 5/2009 | Masuda | ............ | C23C 16/45561 |
| | | | | 118/723 R |
| 2009/0266296 A1* | 10/2009 | Tachibana | ......... | C23C 16/45544 |
| | | | | 118/715 |
| 2013/0183443 A1* | 7/2013 | Hirose | .............. | C23C 16/45561 |
| | | | | 118/712 |
| 2013/0186332 A1* | 7/2013 | Hirose | .............. | C23C 16/45561 |
| | | | | 118/712 |
| 2015/0152551 A1* | 6/2015 | Yamaguchi | ....... | C23C 16/45565 |
| | | | | 118/704 |

FOREIGN PATENT DOCUMENTS

| | | | |
|---|---|---|---|
| JP | 2013-209722 A | 10/2013 | |
| KR | 2001-0110531 A | 12/2001 | |
| KR | 10-2010-0136951 A | 12/2010 | |
| KR | 10-2013-0086569 A | 8/2013 | |

* cited by examiner

PROCESSING APPARATUS

CROSS-REFERENCE TO RELATED APPLICATION

This application claims the benefit of Japanese Patent Application No. 2014-164213, filed on Aug. 12, 2014, in the Japan Patent Office, the disclosure of which is incorporated herein in its entirety by reference.

TECHNICAL FIELD

The present disclosure relates to a processing apparatus that performs a film formation process by supplying a plurality of gases to a target substrate such as a semiconductor wafer and the like.

BACKGROUND

In fabrication of semiconductor devices, semiconductor wafers are repeatedly subjected to various processes, such as film formation, etching, heat treatment, modification, and the like. As a film formation process in which a thin film is formed on a surface of a semiconductor wafer, there is chemical vapor deposition (CVD) in which the semiconductor wafer is placed within a process chamber of a processing apparatus, and a gas including a source gas is introduced to the process chamber to generate a reaction product, so that the reaction product can be deposited on the surface of the semiconductor wafer.

Recently, the film formation has been also carried out through atomic layer deposition in which a source gas and a reaction gas are alternately supplied to a process chamber to form thin films each having an atomic level or molecular level of thickness layer by layer. Since providing good quality of films and enabling an adjustment of the film thickness with high accuracy, ALD has attracted attention as a method for fabricating a semiconductor device to which miniaturization is underway.

Here, one example of formation of a TiN film by an ALD method will be described. In this example, TiN thin films are deposited by repeating a series of processes (1) to (4), so that a TiN film having a desired thickness is obtained.

(1) A source gas, for example, $TiCl_4$ gas, is supplied to a process chamber, so that $TiCl_4$ is attached to a surface of a wafer.

(2) The remaining source gas is removed from the process chamber by purging the process chamber with $N_2$ gas.

(3) A TiN thin film having an atomic level or molecular level of thickness is formed by supplying a reaction gas, for example, $NH_3$ gas, to the process chamber for reaction with $TiCl_4$ attached to the surface of the wafer.

(4) The remaining gas is removed from the process chamber by purging the process chamber with $N_2$ gas.

In the film formation by the ALD method, as described above in formation of the TiN film, supplying plural gases including the source gas and stopping the gas supply must be intermittently performed for a short period of time. In an ALD apparatus which is a film formation apparatus using an ALD method, supply of gas and stop thereof are performed by a controller, wherein the controller sends signals based on a gas supply recipe to an electronic valve which is installed in a gas supply channel through which the gas leads to the process chamber, so as to open or close the electronic valve.

In the film formation apparatus using the ALD method, a time for which one gas is supplied to the process chamber is shorter than that in a film formation apparatus using a CVD method. As a result, in order to form a film having high in-plane uniformity in the film formation using the ALD method, it is necessary to supply a gas under conditions which can increase uniformity of the gas concentration near the wafer within a short period of time after the start of supplying the gas to the process chamber.

Technologies for forming a film having high in-plane uniformity in the film formation using the ALD method are disclosed in the related art.

For example, a gas supply apparatus disclosed in a first related art includes a main body that defines a gas flow passage space having a substantially conical shape to allow a gas to flow therethrough from a small diameter end to a large diameter end, a gas inflow port provided to the small diameter end of the flow passage space to introduce the gas into the flow passage space, and partition members partitioning the flow passage space in a concentric circle shape such that a radially outer side is greater in dimensional diverging rate.

In addition, a film formation apparatus disclosed in a second related art includes a central gas ejection portion disposed above a central region of a substrate, and a surrounding gas supply unit disposed to surround the central gas ejection portion.

Further, an atomic layer formation apparatus disclosed in a third related art includes a plurality of gas supply conduits for supplying a gas including a raw material for forming a thin film on a substrate into a film formation chamber, a plurality of valves respectively provided to the plurality of gas supply conduits, a plurality of film formation chamber monitors monitoring conditions of the film formation chamber, and a controller individually controlling opening degrees or opening times of the plurality of valves based on monitoring results of the plurality of film formation chamber monitors.

According to the first and second conventional technologies, the same kind of gas can be ejected from a plurality of different locations towards the surface of a wafer, thereby enabling the gas to widely spread over the surface of the wafer.

However, it is difficult to say that a film having high in-plane uniformity can be sufficiently formed by the first and second conventional technologies in the film formation using the ALD method. The following reasons are provided. In the first and second conventional technologies, the gas having passed through one gas supply conduit is supplied into a plurality of branches, which in turn are ejected from a plurality of different locations. In these technologies, durations for which the plurality of branch gases are ejected are controlled only by one valve provided to one gas supply conduit.

As described above, in order to form a film having high in-plane uniformity in the film formation using an ALD method, it is necessary to supply a gas under conditions which can increase uniformity of the gas concentration near the wafer within a short period of time after the start of supplying the gas to the process chamber. In the first and second conventional technologies, however, since the durations of ejecting the plurality of branch gases are controlled only by one valve provided to one gas supply conduit, it is difficult to accurately control the gas distribution near the wafer such that those conditions can be met.

Moreover, although not clearly disclosed in the third conventional technology, it is thought from an object of the technology described in the third conventional technology that the same kind of gases are supplied to the film formation chamber substantially at the same time through a plurality of gas supply conduits in the atomic layer formation apparatus. Accordingly, it is thought that a source gas, an oxidation gas, and a purge gas are supplied while being switched to the same plural gas supply conduits and, thus the gases are supplied while being switched to the film formation chamber in this atomic layer formation apparatus. In this method, since complete switching between the gases in the plurality of gas supply conduits takes time, switching between the gases being supplied into the film formation chamber also takes time, thereby causing a problem of time consumption in film formation.

SUMMARY

Some embodiments of the present disclosure provide a processing apparatus which can switch gases used to process a target substrate in a short period of time and can control gas distribution near the target substrate.

According to the embodiment of the present disclosure, provided is a processing apparatus including: a process chamber accommodating a target substrate, a plurality of first gas supply channels configured to supply a plurality of gases to the process chamber excluding a purge gas, the plurality of gases being used in processing the target substrate, a second gas supply channel configured to supply a gas to the process chamber excluding the purge gas, the gas being used in processing the target substrate, a plurality of first valves configured to open and close the plurality of first gas supply channels, a second valve configured to open and close the second gas supply channel, and a controller configured to control an opening/closing operation of the plurality of first valves and the second valve, wherein the plurality of first gas supply channels comprises at least one first gas ejection opening, the second gas supply channel comprises at least one second gas ejection opening placed at locations different from those of the at least one first gas ejection opening, the plurality of first valves comprises a follow-up target valve, the second valve performing the opening/closing operation in response to the follow-up target valve, one of the first gas supply channels opened and closed by the follow-up target valve and the second gas supply channel supply the same gas to the process chamber, and the controller controls the opening/closing operation of the plurality of first valves such that opening durations of the plurality of first valves do not overlap with each other, and controls the opening/closing operation of the second valve such that opening duration of the second valve has a predetermined time relationship with opening duration of the follow-up target valve.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Example of Configuration of Film Formation Apparatus>

Figure 1:
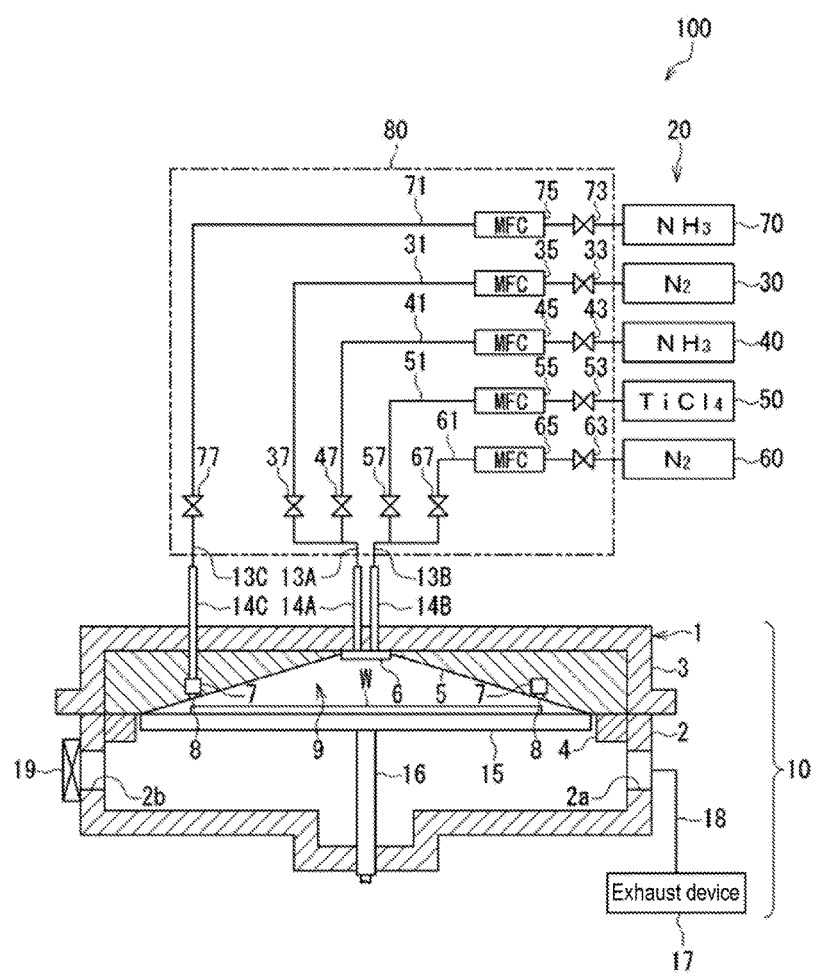
FIG. 1 is a diagram illustrating a schematic configuration of a processing apparatus according to one embodiment of the present disclosure.
Figure 2:
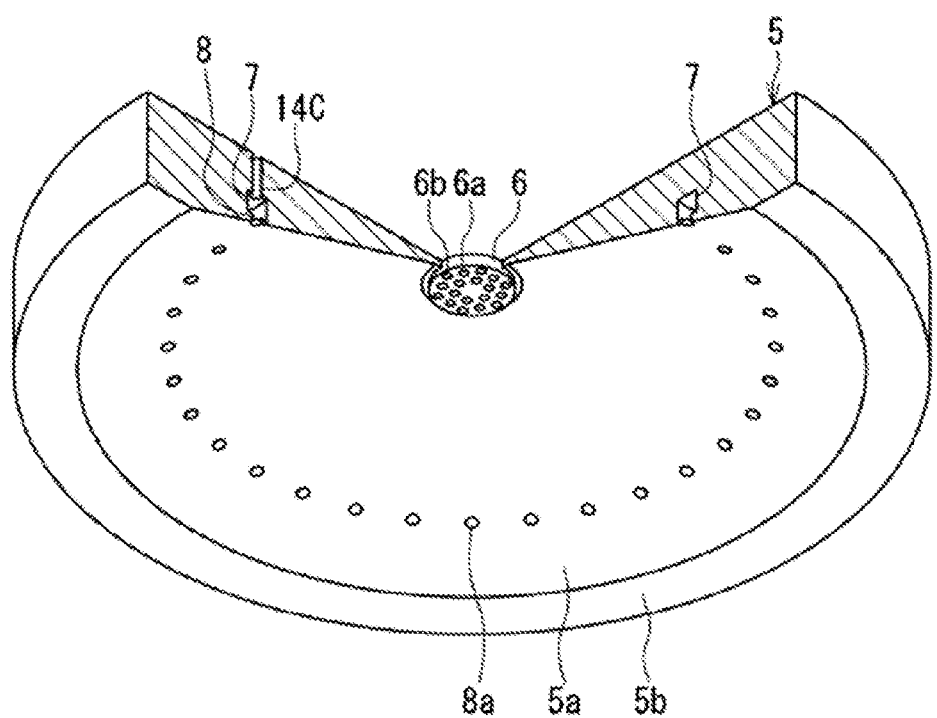
FIG. 2 is a perspective view of a ceiling member and a gas inlet port shown in FIG. 1.
Figure 3:
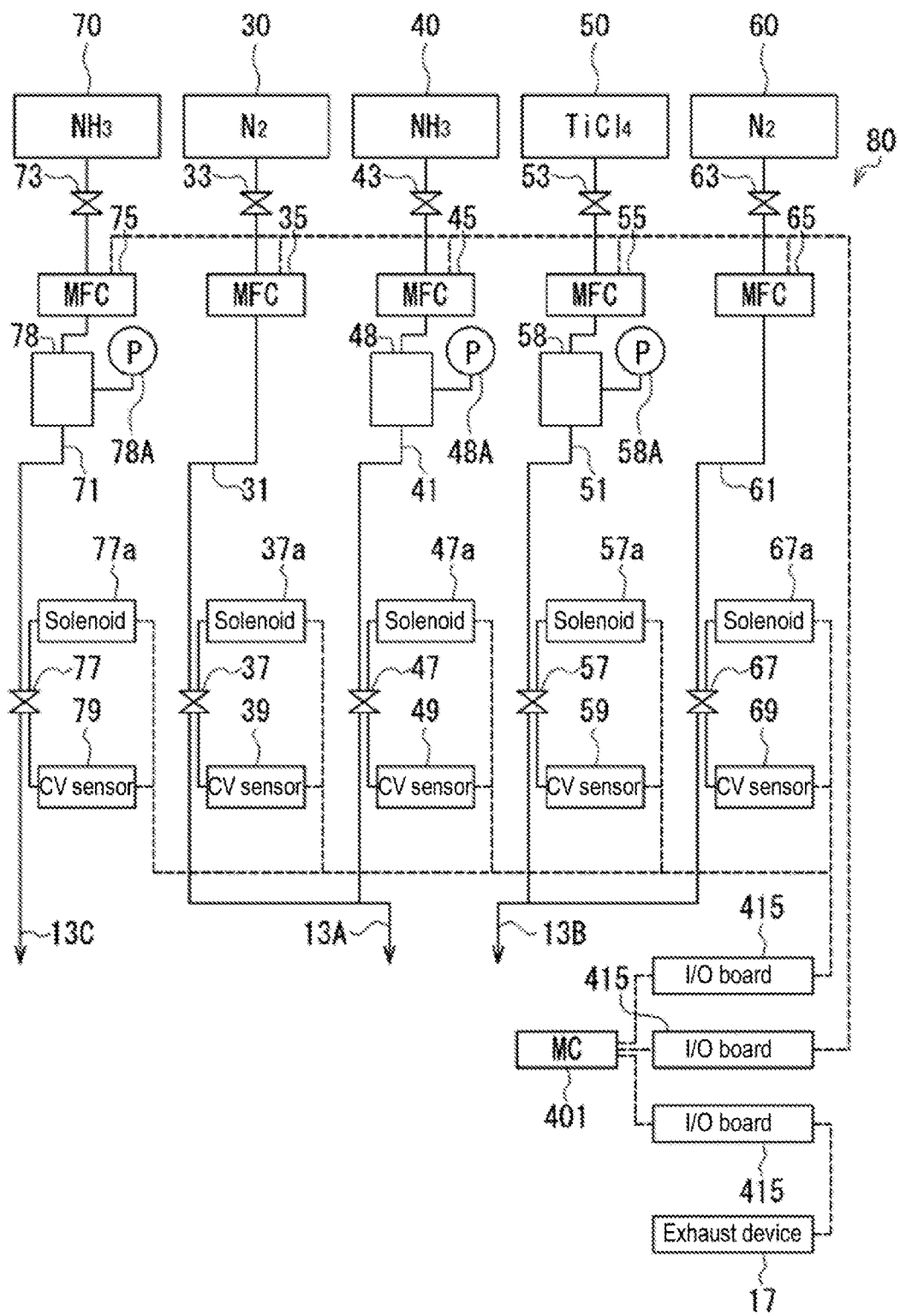
FIG. 3 is a diagram illustrating a collective valve unit shown in FIG. 1.

First, referring to FIGS. 1 to 3, a processing apparatus according to one embodiment of the present disclosure will be described. FIG. 1 is a diagram illustrating a schematic configuration of a processing apparatus according to one embodiment of the present disclosure. FIG. 2 is a perspective view of a ceiling member and a gas inlet port shown in FIG. 1. FIG. 3 is a diagram illustrating a collective valve unit shown in FIG. 1. In FIG. 1, a film formation apparatus 100 is shown as the processing apparatus according to the embodiment of the present disclosure. The film formation apparatus 100 is configured as an atomic layer deposition (ALD) apparatus in which a plurality of gases is intermittently and repeatedly supplied to a target substrate such as a semiconductor wafer W (hereinafter, simply referred to as the "wafer") at different timings. The film formation apparatus 100 includes a process unit 10, a gas supply unit 20 configured to supply a plurality of gases used in processing the wafer W, a collective valve unit 80 disposed between the process unit 10 and the gas supply unit 20, and a controller configured to control a plurality of components in the film formation apparatus 100.

The process unit 10 includes a process chamber 1 which accommodates the wafer W. As shown in FIG. 1, the process chamber 1 includes a lower portion 2 and an upper portion 3 connected to each other and has a substantially cylindrical shape. In addition, the process chamber 1 has an airtight configuration. The process chamber 1 includes an exhaust port 2a and a loading/unloading gate 2b formed in the lower portion 2 of the process chamber 1. In addition, the process unit 10 includes an exhaust device 17, an exhaust conduit 18 connecting the exhaust port 2a to the exhaust device 17, and a gate valve 19 disposed between the loading/unloading gate 2b and a conveyance chamber (not shown). The exhaust device 17 and the exhaust conduit 18 are configured to decompress the interior of the process chamber 1 to a certain vacuum by operating the exhaust device 17. Loading and unloading of the wafer W are performed through the loading/unloading gate 2b and the gate valve 19.

The process unit 10 includes a susceptor 15 configured to support the wafer W in the horizontal state in the process chamber 1, a cylindrical support member 16 configured to support the susceptor 15, and a heater (not shown) embedded in the susceptor 15. The heater serves to heat the wafer W to a certain temperature. The support member 16 is connected to an elevator (not shown) placed outside the process chamber 1. The elevator (not shown) lifts or lowers the susceptor 15 between one location of the susceptor 15 at which transfer of the wafer W is performed and another location (hereinafter, a process location) of the susceptor 15 above the one location of the susceptor 15, at which the wafer W is subjected to a film formation process. FIG. 1 illustrates the susceptor 15 which is in the process location. Further, the support member 16 may be connected to a rotating device (not shown) placed outside the process chamber 1. The rotating device (not shown) rotates the support member 16 to rotate the wafer W supported on the susceptor 15 in the horizontal direction. As the wafer W is rotated in the horizontal direction, it is possible to enhance in-plane uniformity of the film formation on the wafer W along the circumferential direction.

In addition, the process unit 10 includes a ring-shaped member 4 secured to an inner circumferential surface of the lower portion 2 at radially outer position than an outer periphery of the susceptor 15, and a ceiling member 5 secured to the upper portion 3. As shown in FIG. 2, the ceiling member 5 has a disk shape. Here, a part of the ceiling member 5 is omitted in FIG. 2. The ceiling member 5 includes a concave portion 5a formed at a side facing the susceptor 15 and having a conical shape, and a flat section 5b placed radially outward from the concave portion 5a. When the susceptor 15 is placed at the process location, a space surrounded by the concave portion 5a of the ceiling member 5 and an upper surface of the susceptor 15 becomes a process space 9 in which film formation is performed on the wafer W.

Further, the process unit 10 includes a gas ejection portion 6 placed at the center of the concave portion 5a of the ceiling member 5. As shown in FIG. 2, the gas ejection portion 6 includes a plurality of gas ejection openings 6a through which a first reaction gas and a first purge gas described below are ejected into the process space 9, and a plurality of gas ejection openings 6b through which a source gas and a second purge gas described below are ejected into the process space 9. The plurality of gas ejection openings 6a and the plurality of gas ejection openings 6b correspond to "at least one first gas ejection openings" of the present disclosure.

The process unit 10 also includes a ring-shaped buffer portion 7 formed in the ceiling member 5 and placed radially outward from the gas ejection portion 6, and a plurality of gas flow passages 8 connected to the buffer portion 7. The plurality of gas flow passages 8 is disposed between the buffer portion 7 and the process space 9. Further, the plurality of gas flow passages 8 includes a plurality of gas ejection openings 8a formed to eject the second process gas described below therethrough into the process space 9. The plurality of gas ejection openings 8a is disposed at places different from those of the plurality of gas ejection openings 6a and the plurality of gas ejection openings 6b. Specifically, the plurality of gas ejection openings 8a is placed around the plurality of gas ejection openings 6a and the plurality of gas ejection openings 6b. That is, the plurality of gas ejection openings 8a is placed radially outward from the plurality of gas ejection openings 6a and the plurality of gas ejection openings 6b in the concave portion 5a of the ceiling member 5. More specifically, in the ceiling member 5, the plurality of gas ejection openings 6a is formed at a location facing the center of the wafer W supported by the susceptor 15, whereas the plurality of gas ejection openings 8a is formed at a location facing the periphery, i.e., near an edge of the wafer W supported by the susceptor 15. That is, the plurality of gas ejection openings 6a is separated from the plurality of gas ejection openings 8a by a distance of about a radius of the wafer W in a radial direction of the wafer W supported by the susceptor 15. In addition, the plurality of gas ejection openings 8a is annually disposed with a predetermined distance from one another. The plurality of gas ejection openings 8a corresponds to "at least one second gas ejection opening" of the present disclosure. Further, the "at least one second gas ejection opening" may be formed at a location on the ceiling member 5 other than the location facing the periphery of the wafer W. For example, the "at least one second gas ejection opening" may be formed at a location facing a middle portion between the center of the wafer W and the periphery thereof. In addition, the "at least one second gas ejection opening" may be formed at plural locations in the ceiling member 5 in the diameter direction of the wafer W supported by the susceptor 15.

Further, the process unit 10 includes two gas flow passages 14A, 14B connected to the gas ejection portion 6, and a gas flow passage 14C connected to the buffer portion 7. The gas ejection portion 6 includes a first branch flow passage formed between the gas flow passage 14A and the plurality of gas ejection openings 6a and a second branch flow passage formed between the gas flow passage 14B and the plurality of gas ejection openings 6b.

The gas supply unit 20 includes a first purge gas source 30 which supplies a first purge gas, a first reaction gas source 40 which supplies a first reaction gas, a source gas source 50 which supplies a source gas, a second purge gas source 60 which supplies a second purge gas, and a second reaction gas source 70 which supplies a second reaction gas. FIG. 1 and FIG. 3 show the configuration of the gas supply unit 20, e.g., when a TiN film is formed on a surface of the wafer W by an ALD method. In this example, the source gas is $TiCl_4$ gas, and both the first reaction gas and the second reaction gas are $NH_3$ gas. In addition, the first purge gas and the second purge gas are the same $N_2$ gas. The source gas source 50 is provided with an evaporator (not shown) configured to evaporate liquid $TiCl_4$.

The collective valve unit 80 is provided with conduits 31, 41, 51, 61, 71, 13A, 13B, 13C. The conduit 31 is connected at one end thereof to the first purge gas source 30. The conduit 41 is connected at one end thereof to the first reaction gas source 40. Each of the conduits 31, 41 is connected at the other end thereof to one end of the conduit 13A. The other end of the conduit 13A is connected to the gas flow passage 14A.

The conduit 51 is connected at one end thereof to the source gas source 50. The conduit 61 is connected at one end thereof to the second purge gas source 60. Each of the conduits 51, 61 is connected at one end thereof to one end of the conduit 13B. The other end of the conduit 13B is connected to the gas flow passage 14B.

The conduit 71 is connected at one end thereof to the second reaction gas source 70. The other end of the conduit 71 is connected to one end of the conduit 13C. The other end of the conduit 13C is connected to the gas flow passage 14C.

The conduits 31, 13A, the gas flow passage 14A and the first branch flow passage of the gas ejection portion 6 constitute a first purge gas supply channel through which the first purge gas ($N_2$ gas) is supplied to the process chamber 1. The conduits 41, 13A, the gas flow passage 14A and the first branch flow passage of the gas ejection portion 6 constitute a first reaction gas supply channel through which the first reaction gas (NH$_3$ gas) is supplied to the process chamber 1. The conduits 51, 13B, the gas flow passage 14B and the second branch flow passage of the gas ejection portion 6 constitute a source gas supply channel through which the source gas (TiCl$_4$ gas) is supplied to the process chamber 1. The conduits 61, 13B, the gas flow passage 14B and the second branch flow passage of the gas ejection portion 6 constitute a second purge gas supply channel through which the second purge gas (N$_2$ gas) is supplied to the process chamber 1. The conduits 71, 13C, the gas flow passage 14C, the buffer portion 7, and the plurality of gas flow passages 8 constitute a second reaction gas supply channel through which the second reaction gas (NH$_3$ gas) is supplied to the process chamber 1.

The first reaction gas supply channel and the source gas supply channel are gas supply channels configured to supply a plurality of gases used in processing the wafer W to the process chamber 1 excluding the purge gas (N$_2$ gas), and correspond to "a plurality of first gas supply channels" of the present disclosure. The second reaction gas supply channel is a gas supply channel configured to supply a gas used in processing the wafer W to the process chamber 1 excluding the purge gas (N$_2$ gas), and correspond to a "second gas supply channel" of the present disclosure. In addition, the expression "(plurality of) gas(es) used in processing the wafer W . . . excluding the purge gas" means a gas used in the substantial processing of the wafer W (film formation in this embodiment).

The first reaction gas supply channel and the source gas supply channel corresponding to the "plurality of first gas supply channels" of the present disclosure includes the plurality of gas ejection openings 6a and the plurality of gas ejection openings 6b corresponding to the "at least one first gas ejection opening" of the present disclosure. The second reaction gas supply channel corresponding to the "second gas supply channel" of the present disclosure includes the plurality of gas ejection openings 8a corresponding to the "at least one second gas ejection opening" of the present disclosure.

Furthermore, the collective valve unit 80 includes valves 33, 43, 53, 63, 73, mass flow controllers (MFCs) 35, 45, 55, 65, 75, for controlling flow rates and chamber valves 37, 47, 57, 67, 77. The conduit 31 is provided with the valve 33, the MFC 35 and the chamber valve 37 arranged in this order from the first purge gas source 30 side. The conduit 41 is provided with the valve 43, the MFC 45 and the chamber valve 47 arranged in this order from a side of the first reaction gas source 40. The conduit 51 is provided with the valve 53, the MFC 55 and the chamber valve 57 arranged in this order from a side of the source gas source 50. The conduit 61 is provided with the valve 63, the MFC 65 and the chamber valve 67 arranged in this order from a side of the second purge gas source 60. The conduit 71 is provided with the valve 73, the MFC 75 and the chamber valve 77 arranged in this order from a side of the second reaction gas source 70.

Furthermore, the collective valve unit 80 includes a buffer tank 48 disposed between the MFC 45 and the chamber valve 47 in the conduit 41, a pressure gauge 48A provided to the buffer tank 48 to measure an inner pressure of the buffer tank 48, a buffer tank 58 disposed between the MFC 55 and the chamber valve 57 in the conduit 51, a pressure gauge 58A provided to the buffer tank 58 to measure an inner pressure of the buffer tank 58, a buffer tank 78 disposed between the MFC 75 and the chamber valve 77 in the conduit 71, and a pressure gauge 78A provided to the buffer tank 78 to measure an inner pressure of the buffer tank 78. It should be noted that the buffer tanks 48, 58, 78 and the pressure gauges 48A, 58A, 78A are omitted in FIG. 1.

Among such plural components disposed in the conduits 31, 41, 51, 61, 71, each of the chamber valves 37, 47, 57, 67, 77 is placed at the closest location with respect to the process chamber 1. The chamber valves 37, 67 are valves for opening/closing the first and second purge gas supply channels (conduits 31, 61), respectively. The chamber valves 47, 77 are valves for opening/closing the first and second reaction gas supply channels (conduits 41, 71), respectively. The chamber valve 57 is a valve for opening/closing the source gas supply channel (conduit 51). When the chamber valves 37, 47, 57, 67, 77 are open, supply of the respective gases to the process chamber 1 is performed, and when the chamber valves 37, 47, 57, 67, 77 are closed, supply of the respective gases to the process chamber 1 is stopped. The chamber valves 47, 57 correspond to a "plurality of first valves" of the present disclosure. The chamber valve 77 corresponds to a "second valve" of the present disclosure.

All of the chamber valves 37, 47, 57, 67, 77 are electromagnetic valves (solenoid valves) which can be opened or closed at high speed. The chamber valves 37, 47, 57, 67, 77 include solenoids 37a, 47a, 57a, 67a, 77a as valve drivers, respectively. In FIG. 3, the solenoids 37a, 47a, 57a, 67a, 77a are separately illustrated from the chamber valves 37, 47, 57, 67, 77 for convenience sake.

Furthermore, the collective valve unit 80 includes five chamber valve sensors (hereinafter, CV sensors) 39, 49, 59, 69, 79, which are used as sensor units for the chamber valves 37, 47, 57, 67, 77, respectively. The CV sensors 39, 49, 59, 69, 79 detect opening/closing operation of the chamber valves 37, 47, 57, 67, 77 driven by the solenoids 37a, 47a, 57a, 67a, 77a, respectively. It should be noted that the CV sensors 39, 49, 59, 69, 79 are omitted in FIG. 1.

The gas supply unit 20 may be provided with another gas source which supplies a cleaning gas for cleaning the process chamber 1. In this case, the collective valve unit 80 may also include a conduit which connects the additional gas source to one end of the conduit 13A, the conduit 13B or the conduit 13C, and a valve, an MFC and a chamber valve disposed in this conduit.

<Example of Configuration of Control System>

Figure 4:
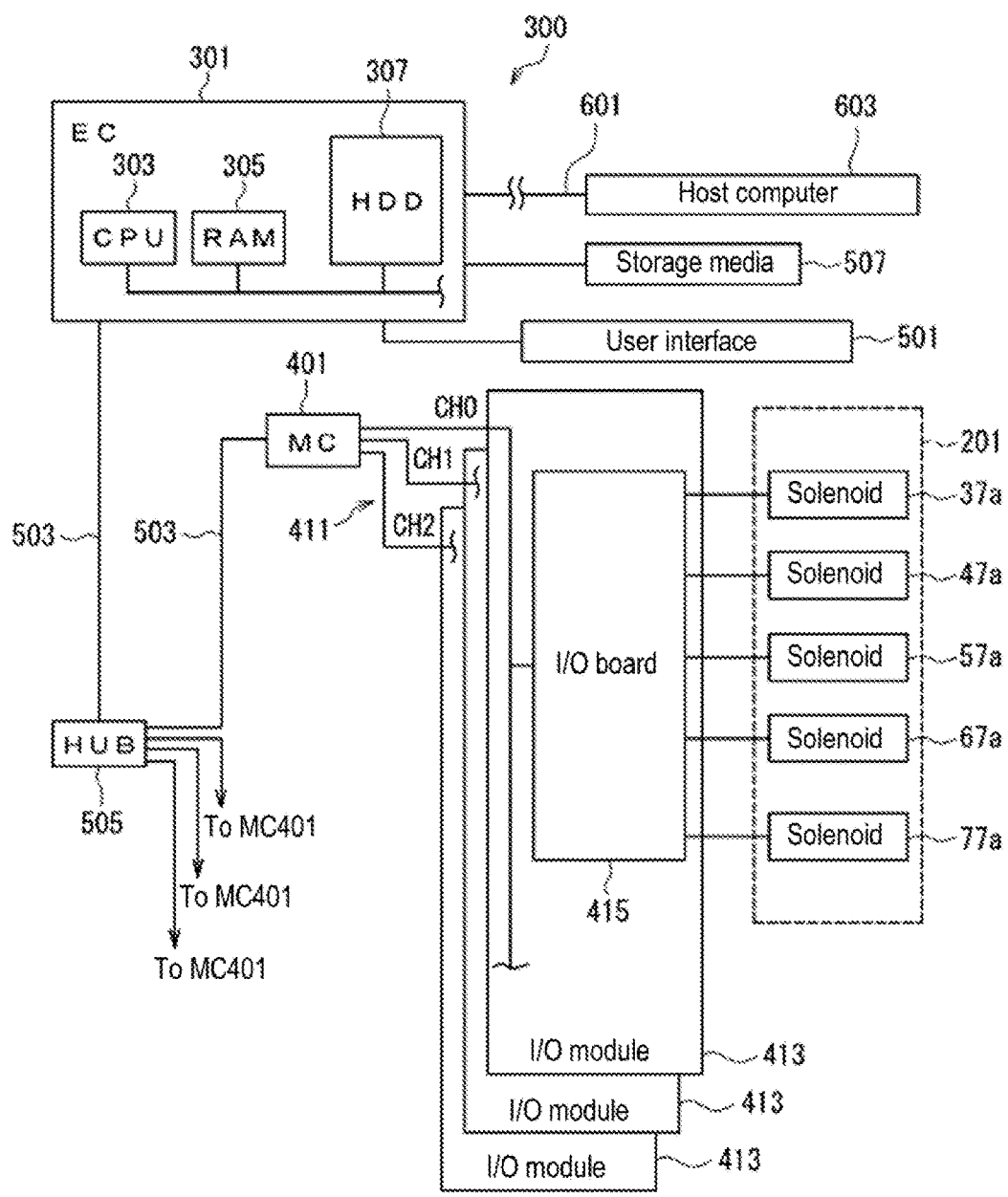
FIG. 4 is a diagram illustrating a schematic configuration of a control system of a substrate processing system including a processing apparatus according to one embodiment of the present disclosure.
Figure 5:
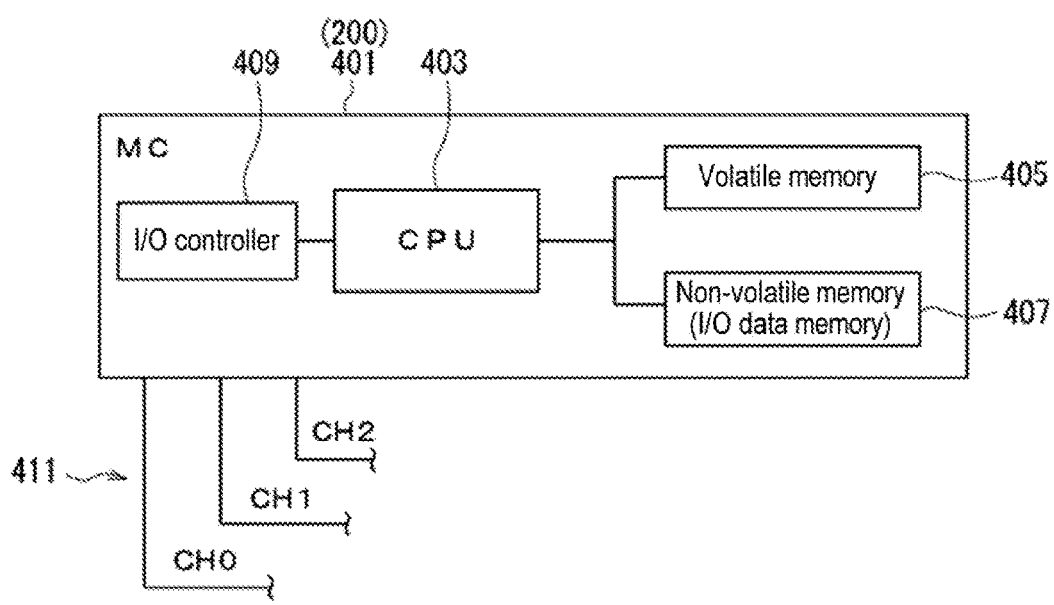
FIG. 5 is a diagram illustrating a schematic configuration of a module controller shown in FIGS. 3 and 4.

Next, referring to FIG. 3 to FIG. 5, a control system of a substrate processing system including the film formation apparatus 100 will be described. FIG. 4 is a diagram illustrating a schematic configuration of a control system of a substrate processing system including the film formation apparatus 100. FIG. 5 is a diagram illustrating a schematic configuration of a module controller shown in FIG. 3 and FIG. 4.

FIG. 4 shows a control system 300 which controls overall operation of the substrate processing system (not shown) including the film formation apparatus 100 or individually controls a plurality of processing apparatuses such as the film formation apparatus 100 and the like in the substrate processing system. The control system 300 includes a controller provided in the film formation apparatus 100. Hereinafter, each of components controlled by the control system 300 will be referred to as an end device 201. In the film formation apparatus 100 shown in FIG. 1, the end devices 201 include the chamber valves 37, 47, 57, 67, 77 (solenoids 37a, 47a, 57a, 67a, 77a), the MFCs 35, 45, 55, 65, 75, the CV sensors 39, 49, 59, 69, 79, the exhaust device 17, and the like.

As shown in FIG. 4, the control system 300 is provided with an equipment controller (EC) 301, which is an overall controller configured to control overall operation of the substrate processing system, a plurality of module controllers (MCs; hereinafter referred to as "MC") 401, a user interface 501 connected to the EC 301, and a local area network (LAN) 503 which connects the EC 301 to each of the MCs 401 in the system. The plurality of MCs 401 individually controls the plurality of processing apparatuses such as the film formation apparatus 100 and the like in the substrate processing system.

Further, a part of the control system 300 which is associated with the control of the film formation apparatus 100 is illustrated in FIG. 4. The MC 401 in FIG. 4 is a module controller for the film formation apparatus 100 among the plurality of MCs provided in the control system 300. The controller provided in the film formation apparatus 100 includes the MC 401 for the film formation apparatus 100. As described below, the film formation apparatus 100 is controlled to perform a predetermined process within the process chamber 1 by the MC 401 for the film formation apparatus 100.

The user interface 501 includes a keyboard by which a process manager performs input manipulation of commands to manage the substrate processing system, a display configured to visualize and display an operation status of the substrate processing system, a mechanical switch, and the like.

The LAN 503 in the system includes a switching hub 505. The switching hub 505 switches the MC 401 connected to the EC 301 in response to a control signal from the EC 301.
(EC)

As shown in FIG. 4, the EC 301 includes a central processing unit (CPU) 303, a random access memory (RAM) 305 as a volatile memory, and a hard disk (HDD in FIG. 4) 307 as a memory unit, and is configured to record data in computer readable memory media (hereinafter, simply referred to as storage media) 507 and to read data therefrom. A control program of the substrate processing system, or recipes relating to a process method for a wafer W may be used by installing the control program or the recipes stored in, for example, the storage media 507 on the hard disk 307. Examples of the storage media 507 may include CD-ROMs, hard disks, flexible disks, flash memories, DVDs, and the like. In addition, the recipes may be transferred from another apparatus, for example, through a dedicated line, and may be electronically used at any time.

In the EC 301, the CPU 303 reads a program (software) including recipes, which are designated through the user interface 501 by a process manager, from the hard disk 307 or the storage media 507. The read program is sent from the EC 301 to the respective MCs 401.

In addition, the EC 301 is connected to a host computer 603, which acts as a manufacturing execution system (MES) controlling an overall manufacturing process of a factory in which the substrate processing system is installed through the LAN 601. In association with the control system 300, the host computer 603 feeds back real-time information related to various processes in the factory to a main operation system (not shown), and makes a decision related to the processes by considering overall load of the factory and the like.
(MC)

The plurality of MCs 401 is collectively controlled by the EC 301. In addition, the MCs 401 can be disposed not only in the plurality of processing apparatuses in the substrate processing system, but also in a load lock chamber or a loader unit, which are also collectively controlled by the EC 301.

Next, the configuration of the MC 401 will be described using the MC 401 for the film formation apparatus 100 as an example. As shown in FIG. 5, the MC 401 includes a CPU 403, a volatile memory 405 formed of RAM and the like, a non-volatile memory 407 used as an input/output (I/O) data memory, and an I/O controller 409. The non-volatile memory 407 is formed of non-volatile memories, for example, SRAM, MRAM, EEPROM, flash memory, and the like. The non-volatile memory 407 stores various history data of components in the film formation apparatus 100, for example, an exchange time of the heater embedded in the susceptor 15, an operating time of the exhaust device 17, and the like. In addition, the non-volatile memory 407 serves as an I/O memory. As described below, the MC 401 is configured to frequently record and store various I/O data (particularly, digital output (DO) data and analog output (AO) data described below) exchanged between the MC 401 and each of the end devices 201 in the non-volatile memory 407.
(I/O Module)

In addition, the control system 300 includes at least one I/O module 413 corresponding to each of the MCs 401, and a network 411 connecting each of the MCs 401 to the at least one I/O module 413. FIG. 4 shows a plurality of I/O modules 413 corresponding to the MCs 401 for the film formation apparatus 100. The network 411 is provided with a plurality of channels CH0, CH1, CH2, . . . allocated to the I/O modules 413, respectively. The controller provided in the film formation apparatus 100 includes at least one I/O module 413 corresponding to the MCs 401 for the film formation apparatus 100 as well as the MCs 401 for the film formation apparatus 100.

The at least one I/O module 413 corresponding to the MC 401 for the film formation apparatus 100 sends control signals to the respective end devices 201 constituting the film formation apparatus 100 and receives input signals from the respective end devices 201. The I/O controller 409 of the MC 401 sends various control signals to the I/O modules 413, or receives status data relating to the respective end devices 201 from the I/O modules 413. The control of each of the end devices 201 by the MC 401 is performed through the I/O module 413.
(I/O Board)

One I/O module 413 includes at least one I/O board 415. The I/O board 415 is a lower hierarchy control unit which is operated under the control of the MC 401 and which directly controls the respective end devices 201. Input/output control of digital signals, analog signals and serial signals in the I/O module 413 is performed by the at least one I/O board 415. At least one end device 201 is connected to one I/O board 415. In this embodiment, as shown in FIG. 4, plural end devices 201, that is, the solenoids 37a, 47a, 57a, 67a, 77a, are connected to one I/O board 415.

Input/output data for one I/O board 415 includes at least one selected from four types of data including digital input data DI, digital output data DO, analog input data AI, and analog output data AO. The digital input data DI include digital data input from each of the end devices 201 which belongs to a lower hierarchy in the control system to the MC 401 which belongs to an upper hierarchy in the control system. The digital output data DO include digital data output from the MC 401 to each of the end devices 201. The analog input data AI include analog data input from each of the end devices 201 to the MC 401. The analog output data AO include analog data input from the MC 401 to each of the end devices 201. In addition, the "analog data" used herein means data obtained through digitization of data having properties indicated by analog values.

The digital input data DI and the analog input data AI include, for example, data relating to a status of each of the end devices 201. The digital output data DO and the analog output data AO include, for example, commands or setting values relating to the process conditions in each of the end devices 201. Examples of the digital data include opening/closing of each of the chamber valves 37, 47, 57, 67, 77 (solenoids 37a, 47a, 57a, 67a, 77a), ON/OFF of the exhaust device 17, opening/closing of valves (not shown) in an exhaust system, and the like. Further, examples of the analog data include, e.g., temperatures set for the heater (not shown) in the susceptor 15, flow rates set for the MFCs 35, 45, 55, 65, 75, and the like.

Input/output data for one I/O board 415 may include plural types of data which can be classified into one of the aforementioned four types of data DI, DO, AI, AO. The input/output data include an address section and a data section. The data section is composed of, for example, 16 bits. In this case, the data section may include digital data having a maximum of 16 bits, or analog data represented with the range of 0000 to FFFF indicated by, e.g., hexadecimal numerals. The address section includes a channel number for specifying a channel, a node number for specifying the I/O board 415, and an I/O address determined by the kind of data stored in the data section. Accordingly, it is possible to specify the data stored in the data section based on the content of the address section, e.g., what channel and what I/O board 415 the data are for, and the kind of data.

The I/O board 415 is implemented by, for example, a programmable logic device, the configuration of which is set by firmware. As the programmable logic device, for example, a field programmable gate array (FPGA) may be used.

<Example of Configuration of Controller>

Figure 6:
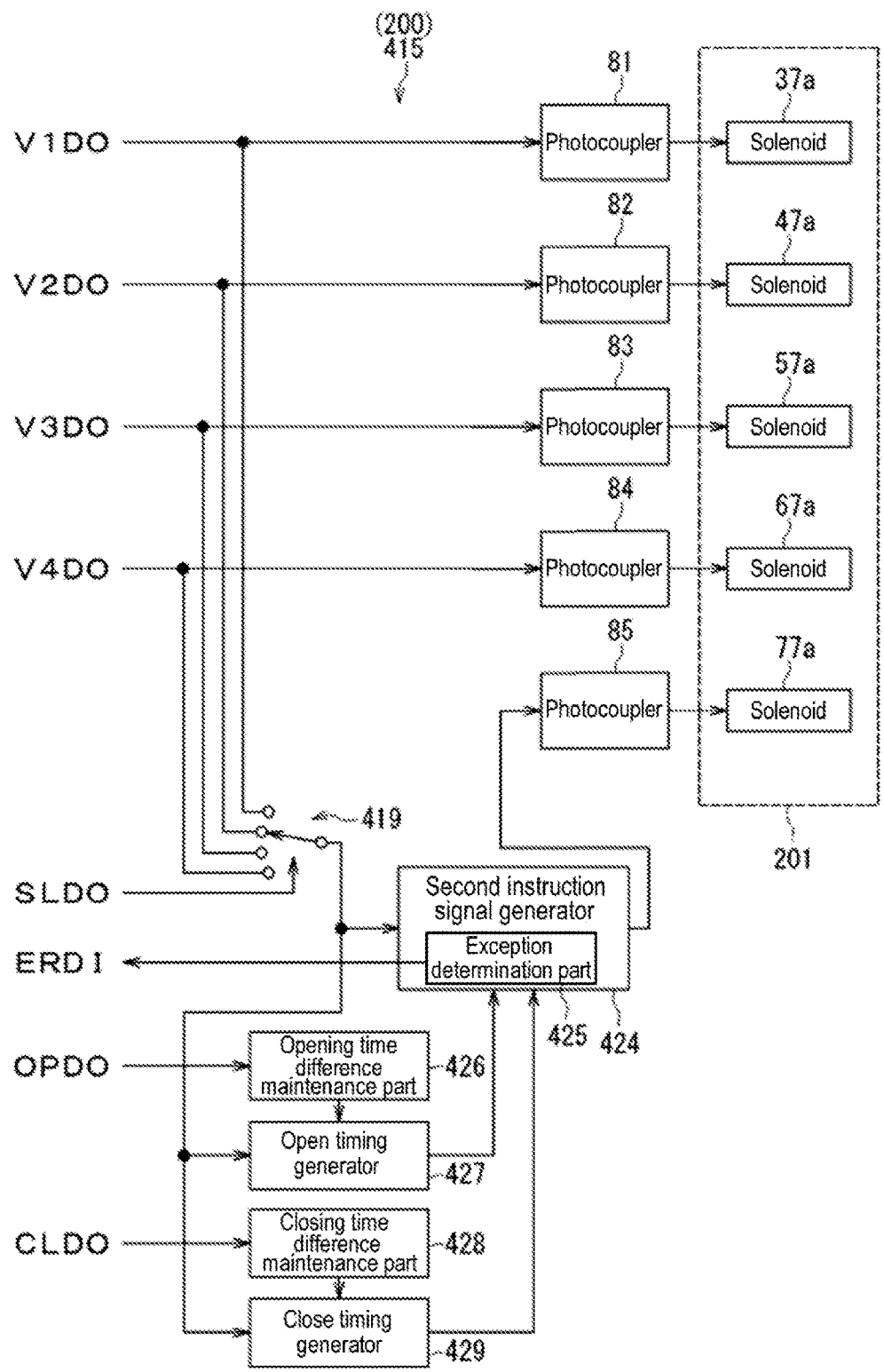
FIG. 6 is a diagram illustrating a configuration of an I/O board shown in FIGS. 3 and 4.

Next, referring to FIG. 5 and FIG. 6, among the controllers of the film formation apparatus 100, a controller relating to control of opening/closing operation of the chamber valves 37, 47, 57, 67, 77 (hereinafter, a gas supply controller 200) will be described. FIG. 6 is a diagram illustrating the configuration of the I/O board 415. The gas supply controller 200 is implemented by the MC 401 for the film formation apparatus 100 as shown in FIG. 5 and the I/O board 415 as shown in FIG. 6, and controls the opening/closing operation of the chamber valves 37, 47, 57, 67, 77. The gas supply controller 200 corresponds to the "controller" of the present disclosure.

As described hereinafter, the gas supply controller 200 controls the opening/closing operation of the chamber valves 47, 57 corresponding to the "plurality of first valves" of the present disclosure, and the opening/closing operation of the chamber valve 77 corresponding to the "second valve" of the present disclosure. That is, the gas supply controller 200 controls the opening/closing operation of the chamber valves 47, 57 such that opening durations of the chamber valves 47, 57 are not overlapped with each other. Furthermore, the gas supply controller 200 controls the opening/closing operation of the chamber valve 77 such that at least a part of an opening duration of the chamber valve 77 overlaps an opening duration of a follow-up target valve corresponding to one of the plurality of first valves with a predetermined time relationship therebetween. Next, an example of a case where the chamber valve 47 is the follow-up target valve will be described. In this example, the gas supply controller 200 controls the opening/closing operation of the chamber valve 77 such that at least a part of the opening duration of the chamber valve 77 overlaps the opening duration of the chamber valve 47 with a predetermined time relationship therebetween. The predetermined time relationship will be described in more detail below.

Hereinafter, the gas supply controller 200 will be described in more detail. The gas supply controller 200 includes an upper hierarchy controller and a low hierarchy controller. In this embodiment, the upper hierarchy controller is implemented by the MC 401. In addition, the lower hierarchy controller is implemented by the I/O board 415.

The upper hierarchy controller (MC 401) and the lower hierarchy controller (I/O board 415) control the opening/closing operation of the chamber valves 47, 57 corresponding to the "plurality of first valves" of the present disclosure in the following way. Namely, the upper hierarchy controller outputs two digital output data (hereinafter, instruction data) V2DO and V3DO including two first instruction signals that instruct the opening/closing operation of the chamber valves 47, 57, respectively. The lower hierarchy controller directly controls the opening/closing operation of the chamber valves 47, 57 by sending the two first instruction signals included in the two instruction data V2DO and V3DO output from the upper hierarchy controller to the chamber valves 47, 57, respectively.

Similarly, the upper hierarchy controller (MC 401) and the lower hierarchy controller (I/O board 415) control the opening/closing operation of the chamber valves 37, 67 in the following way. Namely, the upper hierarchy controller outputs two instruction data V1DO and V4DO including two instruction signals that instruct opening/closing operation of the chamber valves 37, 67, respectively. The lower hierarchy controller directly controls the opening/closing operation of the chamber valves 37, 67 by sending the two instruction signals, which are included in the two instruction data V1DO and V4DO output from the upper hierarchy controller, to the chamber valves 37, 67, respectively.

The four instruction signals included in the instruction data V1DO to V4DO are sent from the lower hierarchy controller (I/O board 415) to the solenoids 37a, 47a, 57a, 67a of the chamber valves 37, 47, 57, 67 through photocouplers 81, 82, 83, 84. The photocouplers 81 to 84 may be disposed in the I/O module 413 (see FIG. 4) or in the I/O board 415.

Furthermore, the upper hierarchy controller (MC 401) and the lower hierarchy controller (I/O board 415) control the opening/closing operation of the chamber valve 77 corresponding to the "second valve" of the present disclosure in the following way. That is, the upper hierarchy controller outputs follow-up target valve designation data SLDO designating which valve is the follow-up target valve among the plurality of first valves. When the chamber valve 47 is the follow-up target valve, the upper hierarchy controller outputs follow-up target valve designation data SLDO indicating that the chamber valve 47 is the follow-up target valve.

The lower hierarchy controller includes a selector 419. The selector 419 selects a first instruction signal, which instructs the opening/closing operation of the follow-up target valve, among the plural first instruction signals which are input to the lower hierarchy controller and which instruct the opening/closing operation of the plurality of first valves, based on the follow-up target valve designation data SLDO output from the upper hierarchy controller. When the chamber valve 47 is the follow-up target valve, the selector 419 selects the first instruction signal that instructs the opening/closing operation of the chamber valve 47, between the two first instruction signals which are included in the two instruction data V2DO and V3DO and which instruct the opening/closing operations of the chamber valves 47, 57. Further, in the embodiment shown in FIG. 6, the selector 419 is configured to select one instruction signal from among a total of four instruction signals including the two first instruction signals mentioned above and the two second instruction signals which are included in the instruction data V1DO and V4DO and which instruct the opening/closing operations of the chamber valves 37, 67.

In addition, the upper hierarchy controller outputs opening time difference data OPDO and closing time difference data CLDO. The opening time difference data OPDO indicates an opening time difference meaning a deviation between a timing of the opening operation of the chamber valve 47 that is the follow-up target valve and a timing of the opening operation of the chamber valve 77. The closing time difference data CLDO indicates a closing time difference meaning a deviation between a timing of the closing operation of the chamber valve 47 that is the follow-up target valve and a timing of the closing operation of the chamber valve 77. Opening duration deviation data indicating a deviation of opening duration of the chamber valve 77 with respect to opening duration of the chamber valve 47 include the opening time difference and the closing time difference.

Further, the lower hierarchy controller includes an opening time difference maintenance part 426 which maintains the opening time difference indicated by the opening time difference data OPDO, and a closing time difference maintenance part 428 which maintains the closing time difference indicated by the closing time difference data CLDO. As used herein, an "opening duration deviation data maintenance unit" is composed of the opening time difference maintenance part 426 and the closing time difference maintenance part 428.

Further, the lower hierarchy controller includes an open timing generator 427 and a close timing generator 429. The first instruction signal selected by the selector 419 is input to the open timing generator 427 and the close timing generator 429. An opening time difference which the opening time difference maintenance part 426 maintains is input to the open timing generator 427. In this embodiment, the open timing generator 427 generates an open timing designation signal for designating the timing of the opening operation of the chamber valve 77 based on a signal instructing the opening operation of the chamber valve 47 among the first instruction signals instructing the opening/closing operation of the chamber valve 47, and the opening time difference. The open timing designation signal designates the timing of the opening operation of the chamber valve 77 deviated from the timing of the opening operation of the chamber valve 47 by the opening time difference.

In addition, a closing time difference which the closing time difference maintenance part 428 maintains is input to the close timing generator 429. In this embodiment, the close timing generator 429 generates a close timing designation signal for designating the timing of the closing operation of the chamber valve 77 based on a signal instructing the closing operation of the chamber valve 47 among the first instruction signals instructing the opening/closing operation of the chamber valve 47, and the closing time difference. The close timing designation signal designates the timing of the closing operation of the chamber valve 77 deviated from the timing of the closing operation of the chamber valve 47 by the closing time difference.

Furthermore, the lower hierarchy controller includes a second instruction signal generator 424, which generates a second instruction signal instructing the opening/closing operation of the chamber valve 77. The open timing designation signal generated by the open timing generator 427 and the close timing designation signal generated by the close timing generator 429 are input to the second instruction signal generator 424. The second instruction signal generator 424 generates the second instruction signal, which instructs the chamber valve 77 to perform the opening operation at a timing designated by the open timing designation signal and to perform the closing operation at a timing designated by the close timing designation signal.

The second instruction signal is sent from the lower hierarchy controller (I/O board 415) to the solenoid 77a of the chamber valve 77 through a photocoupler 85. By the second instruction signal sent in this way, the opening/closing operation of the chamber valve 77 is controlled. Like the photocouplers 81 to 84, the photocoupler 85 may be disposed in the I/O module 413 (see FIG. 4) or in the I/O board 415.

In addition, the first instruction signal selected by the selector 419 is input to the second instruction signal generator 424. The second instruction signal generator 424 includes an exception determination part 425. Operation of the exception determination part 425 will be described below in more detail.

<Film Formation by an ALD Method>

Next, film formation by an ALD method performed using the film formation apparatus 100 shown in FIG. 1 will be described. In film formation by an ALD method, a wafer W loaded on the susceptor 15 is heated by the heater (not shown) within the process chamber 1. In this state, a plurality of gases is intermittently supplied to the wafer W at different timings in a repeated way, whereby a certain thin film is formed on a surface of the wafer W.

By way of example, a process of forming a TiN film by an ALD method will be described. In this example, a TiN film having a desired thickness is formed by repeating a series of processes (1) to (8) such that TiN thin films are repeatedly deposited. In addition, the following series of processes are performed in a state that the valves 33, 43, 53, 63, 73 are open.

(1) The chamber valve 57 is opened to allow $TiCl_4$ gas to be supplied as a source gas from the source gas source 50 to the process chamber 1, so that $TiCl_4$ is attached to the surface of the wafer W.

(2) The chamber valve 57 is closed to stop supply of $TiCl_4$ gas.

(3) The chamber valve 67 is opened to allow $N_2$ gas to be supplied from the second purge gas source 60 to the process chamber 1, so that the interior of the process chamber 1 is purged with the $N_2$ gas, thereby removing the remaining $TiCl_4$ gas from the process chamber 1.

(4) The chamber valve 67 is closed to stop the supply of the $N_2$ gas.

(5) The chamber valves 47, 77 are opened to allow $NH_3$ gas to be supplied as a reaction gas from the first and second reaction gas sources 40, 70 to the process chamber 1, so that a TiN thin film having an atomic level or molecular level of thickness is formed on the surface of the wafer W through reaction with $TiCl_4$ attached to the surface of the wafer W.

(6) The chamber valves 47, 77 are closed to stop the supply of $NH_3$ gas.

(7) The chamber valve 37 is opened to allow $N_2$ gas to be supplied from the first purge gas source 30 to the process chamber 1, so that the interior of the process chamber 1 is purged with the $N_2$ gas, thereby removing the remaining $NH_3$ gas from the process chamber 1.

(8) The chamber valve 37 is closed to stop the supply of the N₂ gas.

Figure 7:
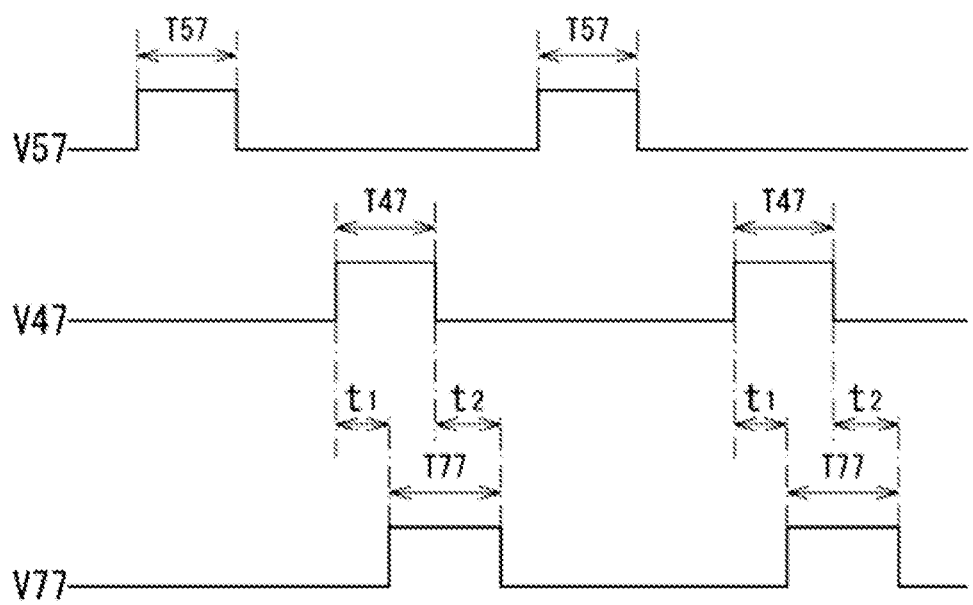
FIG. 7 is a timing chart of one example of operation of three valves according to the embodiment of the present disclosure.

FIG. 7 is a timing chart of one example of operation of three chamber valves 47, 57, 77 in the film formation process using an ALD method. In FIG. 7, the chamber valves 47, 57, 77 are indicated by reference numerals V47, V57, V77, respectively. In the timing charts, a rise and a drop indicate a timing of the opening operation of the chamber valve and a timing of the closing operation thereof, respectively. Further, in FIG. 7, opening durations of the chamber valves 47, 57, 77 are indicated by T47, T57, and T77, respectively. An opening time difference between the timing of the opening operation of the chamber valve 47 and the timing of the opening operation of the chamber valve 77 is indicated by t1, and a closing time difference between the timing of the closing operation of the chamber valve 47 and the timing of the closing operation of the chamber valve 77 is indicated by t2. Further, the timing chart shown in FIG. 7 is schematically shown and actual operation may be carried out in different ways from the timing chart.

As shown in FIG. 7, the gas supply controller 200 controls the opening/closing operation of the chamber valves 47, 57 such that the opening durations T47 and T57 of the chamber valves 47, 57 corresponding to the "plurality of first valves" of the present disclosure are not overlapped with each other. Furthermore, as shown in FIG. 7, the gas supply controller 200 controls the opening/closing operation of the chamber valve 77 corresponding to the "second valve" of the present disclosure such that at least a part of the opening duration T77 of the chamber valve 77 overlaps the opening duration T47 of the chamber valve 47 that is a follow-up target valve with a predetermined time relationship therebetween. In the embodiment shown in FIG. 7, the opening time difference t1 and the closing time difference t2 correspond to the predetermined time relationship.

Further, in the embodiment shown in FIG. 7, the timing of the opening operation of the chamber valve 77 starts later than the timing of the opening operation of the chamber valve 47. Furthermore, the timing of the closing operation of the chamber valve 77 starts later than the timing of the closing operation of the chamber valve 47. Values of the opening time difference t1 and the closing time difference t2 may be different from each other or the same.

Effects of this Embodiment

As described above, the film formation apparatus 100 includes the process chamber 1, the first reaction gas supply channel, the source gas supply channel, the second reaction gas supply channel, the chamber valve 47 configured to open and close the first reaction gas supply channel, the chamber valve 57 configured to open and close the source gas supply channel, the chamber valve 77 configured to open and close the second reaction gas supply channel, and the gas supply controller 200 configured to control the opening/closing operation of the chamber valves 47, 57, 77. The first reaction gas supply channel includes the plurality of gas ejection openings 6a. The source gas supply channel includes the plurality of gas ejection openings 6b. The second reaction gas supply channel includes the plurality of gas ejection openings 8a placed at locations different from those of the plurality of gas ejection openings 6a and the plurality of gas ejection openings 6b.

In this embodiment, the source gas and the first reaction gas are supplied to the process chamber 1 through the source gas supply channel and the first reaction gas supply channel, respectively. Further, the gas supply controller 200 controls the chamber valve 47 configured to open and close the first reaction gas supply channel and the chamber valve 57 configured to open and close the source gas supply channel such that the opening durations T47, T57 of the chamber valves 47, 47 do not overlap with each other. With this configuration, according to this embodiment, it is possible to perform switching between a source gas and a reaction gas supplied to the process chamber 1 in a shorter period of time, as compared with a typical process where the source gas and the reaction gas are supplied to the process chamber 1 while being switched using a common gas supply channel.

Further, the film formation apparatus 100 according to this embodiment includes the second reaction gas supply channel and the chamber valve 77 configured to open and close the second reaction gas supply channel. The second reaction gas supply channel includes the plurality of gas ejection openings 8a placed at locations different from those of the plurality of gas ejection openings 6a, 6b. With this configuration, according to this embodiment, it is possible to allow the first and second reaction gases to spread widely over the surface of the wafer W within a short period of time.

Further, in this embodiment, the gas supply controller 200 controls the opening/closing operation of the chamber valve 77 such that at least a part of the opening duration T77 of the chamber valve 77 overlaps the opening duration T47 of the chamber valve 47 with a predetermined time relationship therebetween. With this configuration, according to this embodiment, a relationship between a period of time of supplying the first reaction gas to the process chamber 1 and a period of time of supplying the second reaction gas to the process chamber 1 may be adjusted. As a result, according to this embodiment, it is possible to minutely control the distribution of the first and second reactions gases near the wafer W, as compared with a typical technique where the period of time of supplying the first reaction gas to the process chamber 1 and the period of time of supplying the second reaction gas to the process chamber 1 are controlled by a single chamber valve.

Further, in this embodiment, particularly, one first gas supply channel (first reaction gas supply channel) opened and closed by the chamber valve 47, and the second gas supply channel (second reaction gas supply channel) opened and closed by the chamber valve 77, supply the same reaction gas, that is, $NH_3$ gas, to the process chamber 1. Thus, according to this embodiment, it is possible to improve concentration uniformity of the $NH_3$ gas near the wafer W by minutely controlling the distribution of the $NH_3$ gas near the wafer W.

The $NH_3$ gas ejected into the process space 9 through the first gas supply channel and the plurality of gas ejection openings 6a diffuses from the vicinity of the center of the wafer W toward the radially outward position of the wafer W. It is thought that $NH_3$ is consumed by reaction with the source gas that is $TiCl_4$ during this process. Here, for example, in processing a large wafer having a diameter of 300 mm or more, when $NH_3$ gas is ejected only from the center of the wafer W, it is sometimes the case that a sufficient amount of $NH_3$ gas can not reach the periphery of the wafer W, whereby film formation reaction is not efficiently performed on the periphery of the wafer. Thus, a non-uniform thickness of the TiN in the plane of the wafer may be caused. On the contrary to this, in this embodiment, separate $NH_3$ gas is supplied towards the periphery of the wafer W through the second reaction gas supply channel and the plurality of gas ejection openings 8a, in addition to the supply through the first gas supply channel and the plurality of gas ejection openings 6a, thereby enabling to uniformly supply NH₃ gas in the plane of the wafer W.

Further, in this embodiment, by considering the diffusion rate of NH₃ gas which is ejected into the process space 9 through the gas ejection openings 6a and which radially outwardly diffuses from the vicinity of the center of the wafer W, the opening/closing operation of the chamber valve 77 is allowed to be responsive to the opening/closing operation of the chamber valve 77. For example, as shown in FIG. 7, the timing of the opening operation of the chamber valve 77 starts later than the timing of the opening operation of the chamber valve 47 by the opening time difference t1. Such time control enables direct supply of a minimum amount of NH₃ gas necessary to supplement a lack of NH₃, which has been consumed by the film formation reaction, to the periphery of the wafer W from the gas ejection openings 8a, thereby achieving uniform film formation in the plane of the wafer W. Further, the configuration where the timing of the opening operation of the chamber valve 77 starts later than the timing of the opening operation of the chamber valve 47 by the opening time difference t1, can save the supply amount of NH₃ gas, as compared with a typical process where the opening operation of the chamber valve 47 and the opening operation of the chamber valve 77 are synchronized with each other. Further, the opening time difference t1 of the chamber valve 77, the opening duration T77, and the flow rate of NH₃ gas ejected through the gas ejection openings 8a may be determined by taking into account the diameter of the wafer W, the flow rate of NH₃ gas ejected through the gas ejection openings 6a, or the diffusion rate thereof.

As described above, according to this embodiment, in the film formation apparatus 100, switching between the first reaction gas and the second reaction gas used in processing the wafer W in a shorter period of time, and controlling distribution of the first and second reaction gases near the wafer W are possible.

Further, in this embodiment, the second instruction signal generator 424 generates the second instruction signal instructing the opening/closing operation of the second chamber valve 77, based on the opening time difference provided by the opening time difference data OPDO and the closing time difference provided by the closing time difference data CLDO. However, the second instruction signal generator 424 may generate the second instruction signal, based on the opening time difference and a preset opening duration T77 of the chamber valve 77.

Figure 8:
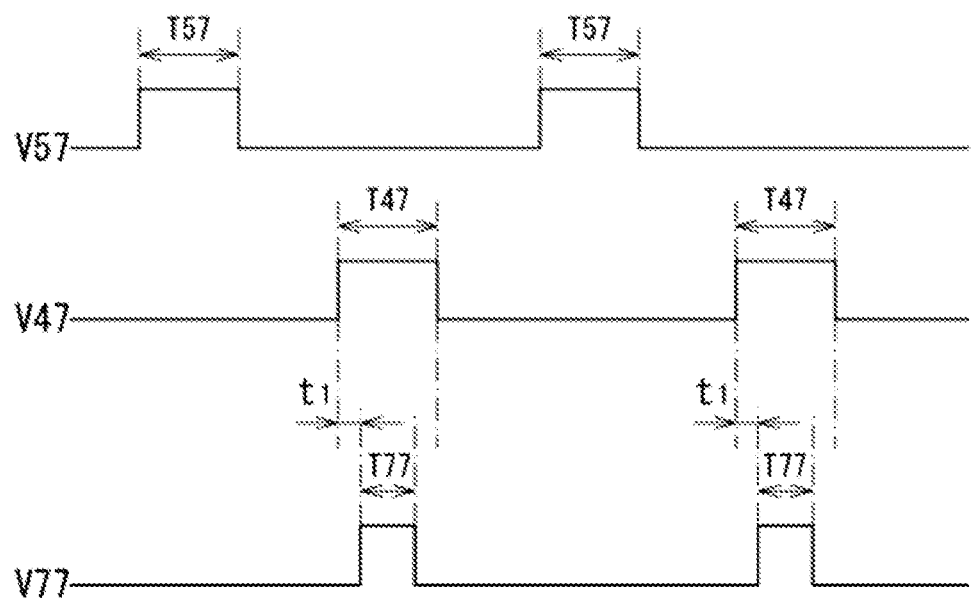
FIG. 8 is a timing chart of another example of operation of three valves according to the embodiment of the present disclosure.

FIG. 8 is a timing chart of an example of the operation of three chamber valves 47, 57, 77, related to a case in which the second instruction signal generator 424 generates the second instruction signal based on the opening time difference and the preset opening duration T77 of the chamber valve 77, as described above. A method of indicating the operation of the chamber valves 47, 57, 77 in FIG. 8 is the same as the method in FIG. 7. In a case of generating the second instruction signal in a way described above, the opening duration T77 of the chamber valve 77 may be sometimes shorter than the opening duration T47 of the chamber valve 47, and the timing of the closing operation of the chamber valve 77 may precede the timing of the closing operation of the chamber valve 47, as shown in FIG. 8.

In addition, although the opening duration T77 of the chamber valve 77 partially overlaps the opening duration T47 of the chamber valve 47 that is the follow-up target valve, in the examples shown in FIG. 7 and FIG. 8, it should be noted that the opening duration T77 does not necessarily overlap the opening duration T47.

Further, in this embodiment, the gas supply controller 200 maintains opening duration deviation data (opening time difference and closing time difference), which indicate deviation of the opening duration T77 of the chamber valve 77 with respect to the opening duration T47 of the chamber valve 47 that is the follow-up target valve, and determines the opening duration T77 of the chamber valve 77 with reference to the opening duration T47 of the chamber valve 47, based on the opening duration deviation data. However, alternatively, the gas supply controller 200 may maintain opening duration deviation data, which indicate deviation of the opening duration T77 of the chamber valve 77 with respect to the opening duration T57 of the chamber valve 57, which is another first valve other than the follow-up target valve, and determine the opening duration T77 of the chamber valve 77 with reference to the opening duration T57 of the chamber valve 57, based on the opening duration deviation data. In this example, the deviation of the timing of the opening operation of the chamber valve 77 with respect to the timing of the opening operation of the chamber valve 57, and the deviation of the timing of the closing operation of the chamber valve 57 with respect to the timing of the closing operation of the chamber valve 77 become relatively large. As a result, in this case, it is possible to generate the second instruction signal with a sufficient process time.

<Operation of Exception Determination Unit>

Next, referring to FIG. 6 and FIG. 7, operation of the exception determination part 425 will be described. The exception determination part 425 determines whether the second instruction signal generated by the second instruction signal generator 424 is normal or abnormal, and outputs digital input data (hereinafter, referred to as "error data") ERDI that inform the upper hierarchy controller (MC 401) of abnormality of the second instruction signal, if the second instruction signal is abnormal. As one example of the abnormal second instruction signal, the opening time difference t1, which corresponds to a deviation of the timing of the opening operation of the chamber valve 77 with respect to the timing of the opening operation of the chamber valve 47 that is the follow-up target valve, is so large that the opening durations T47, T77a of the chamber valves 47, 77 can not overlap. As another example of the abnormal second instruction signal, the closing time difference t2, which corresponds to a deviation of the timing of the closing operation of the chamber valve 77 with respect to the timing of the closing operation of the chamber valve 47 is so large that the opening duration T77 of the chamber valve 77 overlaps the next opening duration T47 of the chamber valve 47. Upon receiving the error data ERDI, the upper hierarchy controller (MC 401) controls the respective components of the film formation apparatus 100 so as to stop the film formation process of the film formation apparatus 100.

Further, it should be understood that the present disclosure is not limited to the above embodiment and can be modified in various ways. For example, the gas supply controller 200 may be configured to allow the upper hierarchy controller (MC 401) to output instruction data including the second instruction signal that instructs the closing operation of the chamber valve 77. In this case, the lower hierarchy controller (I/O board 415) directly controls the opening/closing operation of the chamber valve 77 by providing the second instruction signal included in the instruction data to the chamber valve 77. Further, in this case, it is possible to adjust the timing of the opening operation of the chamber valve 77 to precede the timing of the opening operation of the chamber valve 47.

Furthermore, it should be understood that the processing apparatus according to the present disclosure is not limited to an ALD apparatus and may be applied to other apparatuses capable of performing film formation by supplying a plurality of gases. Furthermore, it should be understood that the present disclosure may also be applied to a processing apparatus configured to process large glass substrates and the like used in liquid crystal displays, organic EL displays, thin film solar cell panels, and the like, without being limited to the semiconductor wafer.

In the processing apparatus according to the present disclosure, the controller controls an opening/closing operation of a plurality of first valves such that opening durations of the plurality of first valves do not overlap, and controls an opening/closing operation of a second valve such that opening duration of the second valve has a predetermined time relationship with opening duration of a follow-up target valve that is one of the plurality of first valves. With this configuration, the processing apparatus according to the present disclosure can achieve switching between gases used in target substrate processing in a shorter period of time, and can control distribution of gas near the target substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing apparatus comprising:
   a process chamber accommodating a target substrate,
   a plurality of first gas supply channels configured to supply a plurality of gases to the process chamber excluding a purge gas, the plurality of gases being used in processing the target substrate,
   a second gas supply channel configured to supply a gas to the process chamber excluding the purge gas, the gas being used in processing the target substrate,
   a plurality of first valves configured to open and close the plurality of first gas supply channels,
   a second valve configured to open and close the second gas supply channel, and
   a controller configured to control an opening/closing operation of the plurality of first valves and the second valve,
   wherein the plurality of first gas supply channels comprises at least one first the gas ejection opening within the process chamber,
   the second gas supply channel comprises at least one second gas ejection opening placed at locations different from those of the at least one first gas ejection opening,
   the plurality of first valves comprises a follow-up target valve, the second valve performing the opening/closing operation in response to the follow-up target valve,
   one of the first gas supply channels opened and closed by the follow-up target valve and the second gas supply channel supply the same gas to the process chamber,
   the controller controls the opening/closing operation of the plurality of first valves such that opening durations of the plurality of first valves do not overlap with each other, and controls the opening/closing operation of the second valve such that opening duration of the second valve has a predetermined time relationship with opening duration of the follow-up target valve,
   wherein the controller includes an upper hierarchy controller configured to output a plurality of first instruction signals instructing the opening operation of the plurality of first valves, respectively, and a lower hierarchy controller configured to directly control the opening/closing operation of the plurality of first valves by providing the plurality of first instruction signals output from the upper hierarchy controller to the plurality of first valves, respectively,
   wherein the lower hierarchy controller includes an opening duration deviation data maintenance part configured to maintain opening duration deviation data indicating a deviation of the opening duration of the second valve with respect to the opening duration of the follow-up target valve, and a second instruction signal generator configured to generate a second instruction signal instructing the opening/closing operation of the second valve, based on a first instruction signal instructing the opening/closing operation of the follow-up target valve among the plurality of first instruction signals and the opening duration deviation data maintained by the opening duration deviation data maintenance part, and
   wherein the opening/closing operation of the second valve is controlled by the second instruction signal.

2. The processing apparatus of claim 1, wherein at least a part of the opening duration of the second valve overlaps the opening duration of the follow-up target valve.

3. The processing apparatus of claim 1, wherein the at least one second gas ejection opening is a plurality of second gas ejection openings placed around the at least one first gas ejection opening.

4. The processing apparatus of claim 1, wherein the upper hierarchy controller outputs follow-up target valve designation data indicating which one of the plurality of first valves is the follow-up target valve, and
   the lower hierarchy controller comprises a selector configured to select the first instruction signal instructing the opening/closing operation of the follow-up target valve among the plurality of first instruction signals based on the follow-up target valve designation data output from the upper hierarchy controller.

5. The processing apparatus of claim 1, wherein the processing apparatus is an atomic layer deposition (ALD) apparatus configured to perform film formation by intermittently supplying the plurality of gases from the plurality of first gas supply channels to the target substrate at different timings in a repeated way.

* * * * *

UNITED STATES PATENT AND TRADEMARK OFFICE
CERTIFICATE OF CORRECTION

PATENT NO. : 9,725,804 B2
APPLICATION NO. : 14/820723
DATED : August 8, 2017
INVENTOR(S) : Katsuhito Hirose and Toshio Miyazawa Page 1 of 1

It is certified that error appears in the above-identified patent and that said Letters Patent is hereby corrected as shown below:

In the Claims

Claim 1, Column 19, Line 52, please delete the word "the" between "first" and "gas ejection".

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*